(12) United States Patent
Sasaki et al.

(10) Patent No.: US 7,146,555 B2
(45) Date of Patent: Dec. 5, 2006

(54) ERROR CORRECTION METHOD, APPARATUS AND PROGRAM PRODUCT

(75) Inventors: Takashi Sasaki, Saitama (JP); Masao Yoshida, Saitama (JP); Kazunori Matsuo, Saitama (JP); Shinichi Naohara, Saitama (JP); Yasuhisa Okamoto, Saitama (JP)

(73) Assignee: Pioneer Corporation, Tokyo (JP)

( * ) Notice: Subject to any disclaimer, the term of this patent is extended or adjusted under 35 U.S.C. 154(b) by 498 days.

(21) Appl. No.: 10/724,622

(22) Filed: Dec. 2, 2003

(65) Prior Publication Data

US 2004/0111661 A1    Jun. 10, 2004

(30) Foreign Application Priority Data

Dec. 2, 2002   (JP)   ............ P2002-349563

(51) Int. Cl.
 *H03M 13/00* (2006.01)
 *G06F 11/00* (2006.01)

(52) U.S. Cl. .................... 714/755; 714/746
(58) Field of Classification Search ............. 714/755
 See application file for complete search history.

(56) References Cited

U.S. PATENT DOCUMENTS

| | | | |
|---|---|---|---|
| 4,646,301 A * | 2/1987 | Okamoto et al. ........... 714/755 |
| 4,653,051 A | 3/1987 | Sugimura et al. | |
| 4,845,714 A | 7/1989 | Zook | |
| 6,108,372 A | 8/2000 | Tidemann, Jr. et al. | |
| 6,457,156 B1 | 9/2002 | Stenfort | |
| 6,807,648 B1 * | 10/2004 | Cansever et al. .......... 714/776 |
| 2003/0005385 A1 * | 1/2003 | Stieger ..................... 714/758 |

FOREIGN PATENT DOCUMENTS

EP    1 388 859 A1    2/2004

OTHER PUBLICATIONS

Shu Lin et al: "Automatic-Repeat-Request Error-Control Schemes", IEEE Communications Magazine, IEEE Service Center Piscataway, N.J, US, vol. 22, No. 12, Dec. 1, 1984, pp. 5-17, XP 000674086.

* cited by examiner

*Primary Examiner*—Shelly Chase
(74) *Attorney, Agent, or Firm*—Sughrue Mion, PLLC

(57) ABSTRACT

An error correction apparatus includes: an error correction circuit 6 for performing a data error correction based on a first error correction algorithm selected from among a plurality of error correction algorithms having different correction strengths; an error determination unit 8a for using the first error correction algorithm to detect that the data error correction has been disabled; and a computer 8 for selecting a second error correction algorithm from the plurality of error correction algorithms, and for controlling the error correction circuit 6 to use the second error correction algorithm to perform the error correction for data for which it has been determined that the first error correction algorithm is not capable of correcting errors in the data.

19 Claims, 3 Drawing Sheets

(CONT.)

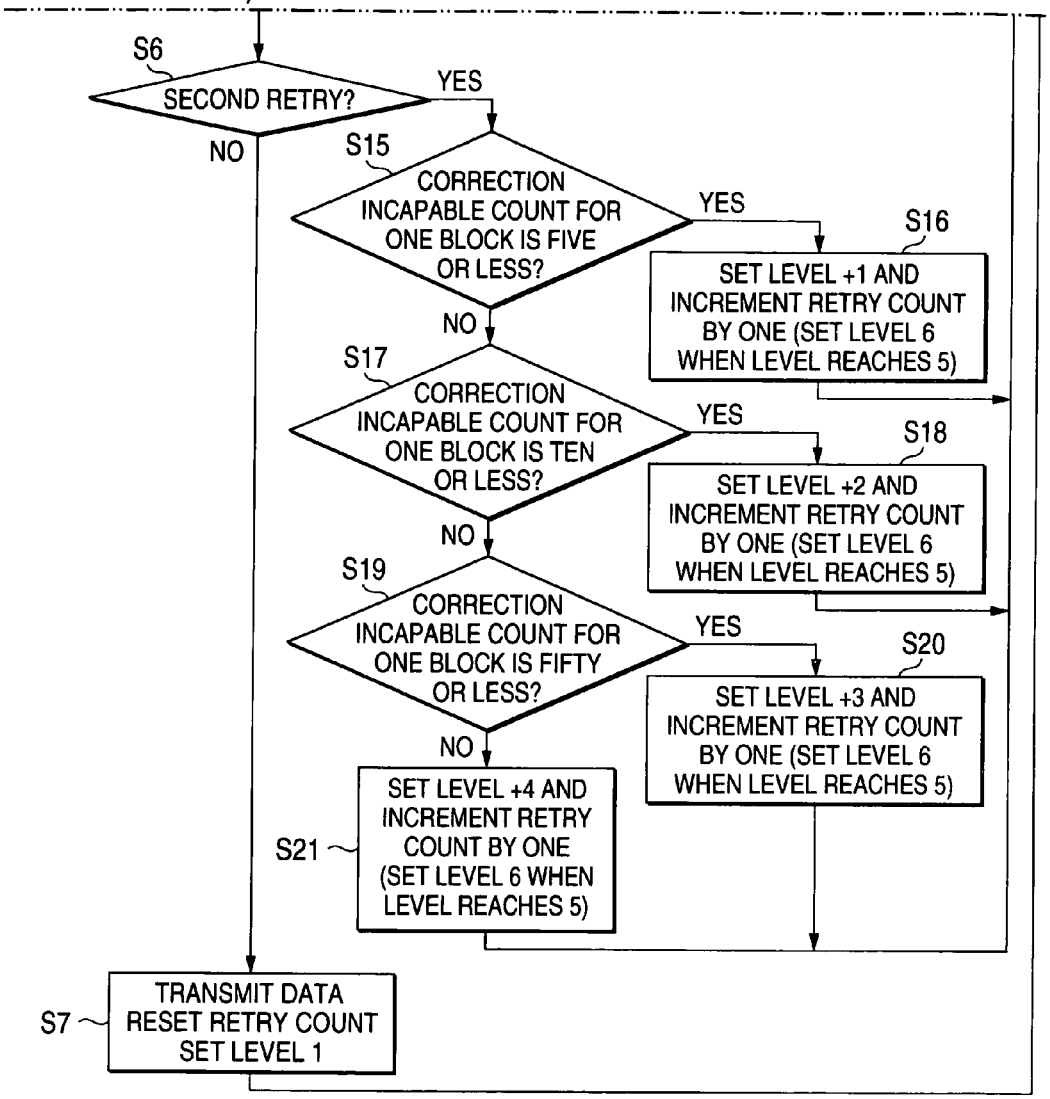

ERROR CORRECTION METHOD, APPARATUS AND PROGRAM PRODUCT

The present disclosure relates to the subject matter contained in Japanese Patent Application No. 2002-349563 filed on Dec. 2, 2002, which is incorporated herein by reference in its entirety.

BACKGROUND OF THE INVENTION

1. Field of the Invention

The present invention relates to an error correction method, an apparatus and a program product for performing error correction for data.

2. Description of the Related Art

Data recorded on a disk such as a DVD (Digital Versatile Disc) include data (ECC: Error Correction Code) blocks, wherein correction codes have been added to original data, and when the data are read from the disk, error corrections are performed for all the ECC blocks. An ECC block, which is the minimum data recording unit, is composed of user data in 16 sectors of 2048 bytes each, a total memory capacity of 32 K bytes, and includes added error codes. By performing an error correction for each ECC block, the reliability of the data can be improved. In an ECC block, each row includes 182 bytes and each column includes 208 bytes, and the error correction can be performed for up to five bytes in one row. When there is an error exceeding five bytes in a row, the row is defined as an error correction incapable row. This error correction process is performed for all 208 rows (hereinafter referred to a C1 error correction). And when there is an error exceeding 16 bytes in one column, this column is defined as an error correction incapable column. This error correction process is performed for all 182 columns (hereinafter referred to as a C2 error correction).

A disk reproduction apparatus, which reduces the data, to which the ECC data has been added, recorded on a disk, performs an error correction process for each ECC block, and performs other processes, such as data decompression, and outputs an audio signal and a video signal.

However, since the error correction process is conventionally limited to a predetermined single type, EDC (Error Defection Code) errors tend to occur frequently when the quality of the data is poor, and deterioration of the error correction capability occurs.

SUMMARY OF THE INVENTION

The invention was made in view of such a conventional circumference and an object of the invention is to solve a problem of an occurrence of a deterioration of the error correction capability.

In order to achieve the object, according to a first aspect of the invention, there is provided an error correction method for performing error correction for data to which error correction data have been added, the method including: selecting a first error correction algorithm from a plurality of error correction algorithms having different correction strengths; employing the selected first error correction algorithm to perform error correction for the data; determining whether or not the first error correction algorithm is capable of correcting errors in the data; selecting a second error algorithm from the plurality of error correction algorithms when it is determined that the first error correction algorithm is not capable of correcting errors in the data; and employing the selected second error correction algorithm to perform error correction for the data.

According to a second aspect of the invention, there is provided an error correction apparatus for performing error correction for data to which error correction data have been added, including: an error correction unit configured to perform error correction for the data using a first error correction algorithm that has been selected from among a plurality of error correction algorithms having different correction strengths; a determination unit configured to determine whether or not the error correction for the data using the first error correction algorithm is capable; and a controlling unit configured to select a second error correction algorithm from the plurality of error correction algorithms and to control the error correction unit to perform error correction using the second error correction algorithm, for the data in which determined that the error correction using the first error correction algorithm is incapable.

According to a third aspect of the invention, there is provided an error correction program product for causing a computer system to execute procedures for performing error correction for data to which error correction data have been added, the program product including: a unit for selecting a first error correction algorithm from a plurality of error correction algorithms having different correction strengths; a unit for employing the selected first error correction algorithm to perform error correction for the data; a unit for determining whether or not the first error correction algorithm is capable of correcting errors in the data; a unit for selecting a second error algorithm from the plurality of error correction algorithms when it is determined that the first error correction algorithm is not capable of correcting errors in the data; and a unit for employing the selected second error correction algorithm to perform error correction for the data.

BRIEF DESCRIPTION OF THE DRAWINGS

The above objects and advantages of the present invention will become more apparent by describing a preferred exemplary embodiment thereof in detail with reference to the accompanying drawings, wherein.

DETAILED DESCRIPTION OF THE PREFERRED EMBODIMENTS

A preferred exemplary embodiment of the present invention will now be described.

Figure 1:
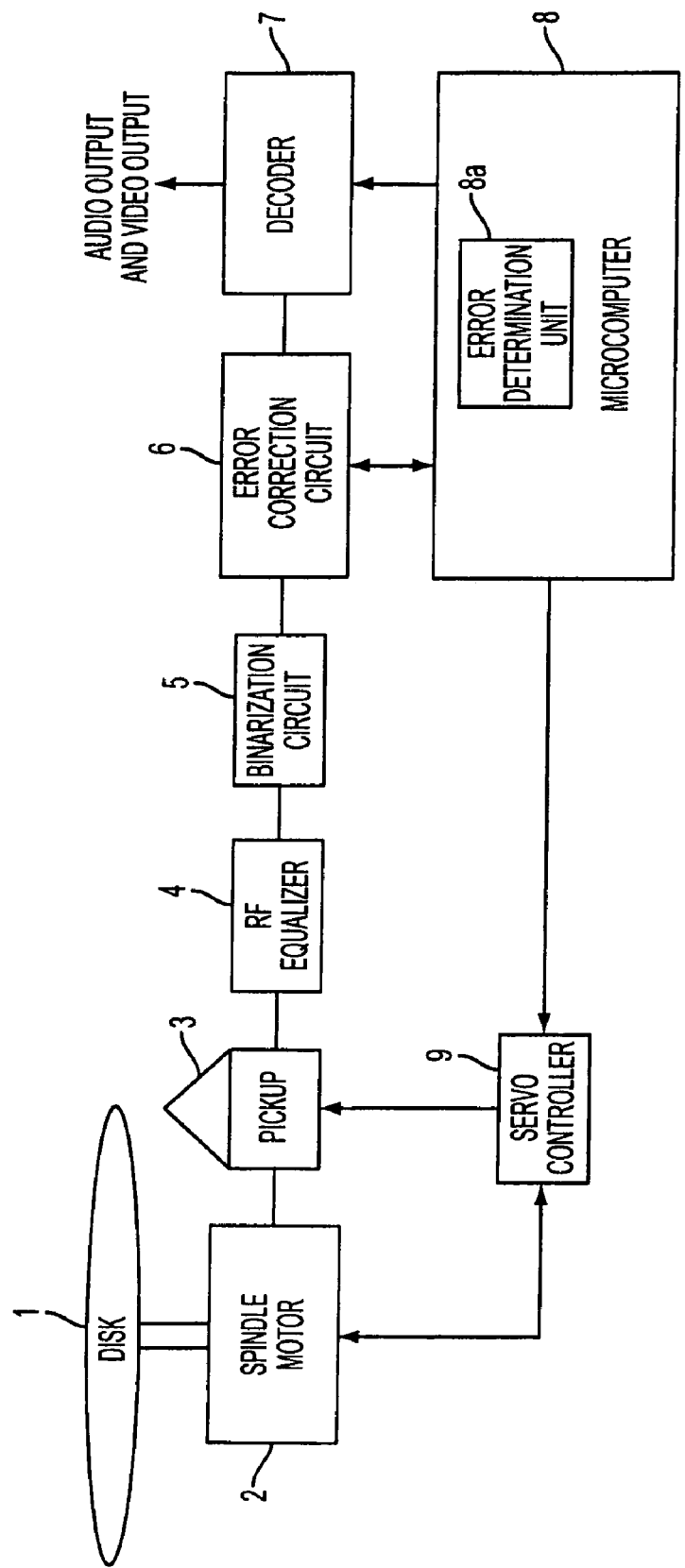
FIG. 1 is a block diagram showing a configuration of a reproduction system in which an error correction apparatus according to the present invention is mounted.

FIG. 1 is a block diagram showing the configuration of a reproduction system in which an error correction apparatus according to the present invention is mounted. In the error correction apparatus, as shown in FIG. 1, a spindle motor 2 rotates a disk 1 on which data are recorded, and a pickup 3 located near the disk 1 optically reads the data.

The data recorded on the disk 1 are read by the pickup 3 and outputted to the RF equalizer (RFEQ) 4. The RF equalizer 4 corrects variance of frequency characteristic, which occurs due to changes in the inner and outer speeds of the disk 1 relative to the speed of the pickup 3, included in the data output from the pickup 3. The data output from the RF equalizer 4 is inputted to an error correction circuit 6 via a binarization circuit 5 and being performed an error correction by the error correction circuit 6. A decoder 7 decodes the data output from the error correction circuit 6 and outputs the decoded data as audio or video output.

An error determination unit 8a for a computer (hereinafter referred to as a microcomputer) 8 employs the output of the error correction circuit 6 to determine whether there are error correction incapable data. Then, the microcomputer 8 permits the error correction circuit 6 to perform an error correction based on an error correction algorithm, which is selected from among a plurality of error correction algorithms having different correction strengths.

A plurality of error correction algorithms having different correction strengths are set up in the error correction circuit 6. Upon the reception of a control signal from the microcomputer 8, the error correction circuit 6 selects one of the error correction algorithms and performs the error correction.

Assuming that the error correction algorithm being selected at the time the error correction has occurred is a first error correction algorithm, and the error correction algorithm selected by the microcomputer 8 after an error has occurred is a second correction algorithm, there are three possible cases: a case wherein the second error correction algorithm in which the correction strength is greater than that in the first error correction algorithm, is selected; a case wherein the first error correction algorithm is selected as the second error correction algorithm; and a case wherein an error correction algorithm in which correction strength having one level higher than that in the previous algorithm (the first error correction algorithm), is selected one after another as the second algorithm. To select the second algorithm, the correction strength of which is greater than is that of the first error correction algorithm, the level of the error correction algorithm to be selected can be appropriately chosen in accordance with the error correction results (the number of incapable data sets, and the error rate), which represent the effects produced by the error correction. The microcomputer 8 obtains the error correction incapable data from the error correction circuit 6, and permits the error correction circuit 6 to repeat the selection of the error correction algorithms a plurality of times, until all error corrections have been completed.

The error correction algorithm is a combination of a C1 error correction performed in the direction of the rows and a C2 error correction performed in the direction of the columns. By changing the times and the directions in which the error corrections are made, different error correction algorithms having a variety of correction strengths can be generated. In the embodiment, the following error correction algorithms are set in the error correction circuit 6: level 1 (C1 to C2), to perform a C2 error correction following a C1 error correction; level 2 (C2 to C1), to perform a C1 error correction following a C2 error correction; level 3 (C1 to C2 to C1), to perform a C2 error correction following a C1 error correction, and to then perform a C1 error correction; level 4 (C2 to C1 to C2), to perform a C1 error correction following a C2 error correction, and to then perform a C2 error correction; and level 5 (C1 to C2 to C1 to C2), to perform a C2 error correction following a C1 error correction, and to then perform a C2 error correction following the C1 error correction. That is, the correction strength is changed by multiplying the times error corrections are performed and the error correction directions are changed. As the number of repetitions for the C1 error corrections and the C2 error corrections is increased, the probability that the data will be corrected is also increased, or as the error corrections are initiated, beginning with the direction of columns wherein there are a larger number of bytes, the probability that correction errors will be removed is also increased. The correction strength is incremented step by step in the ascending order, beginning at level 1, the error correction algorithm having the lowest correction strength, while level 5 is the error correction algorithm having the highest correction strength.

Figure 2:
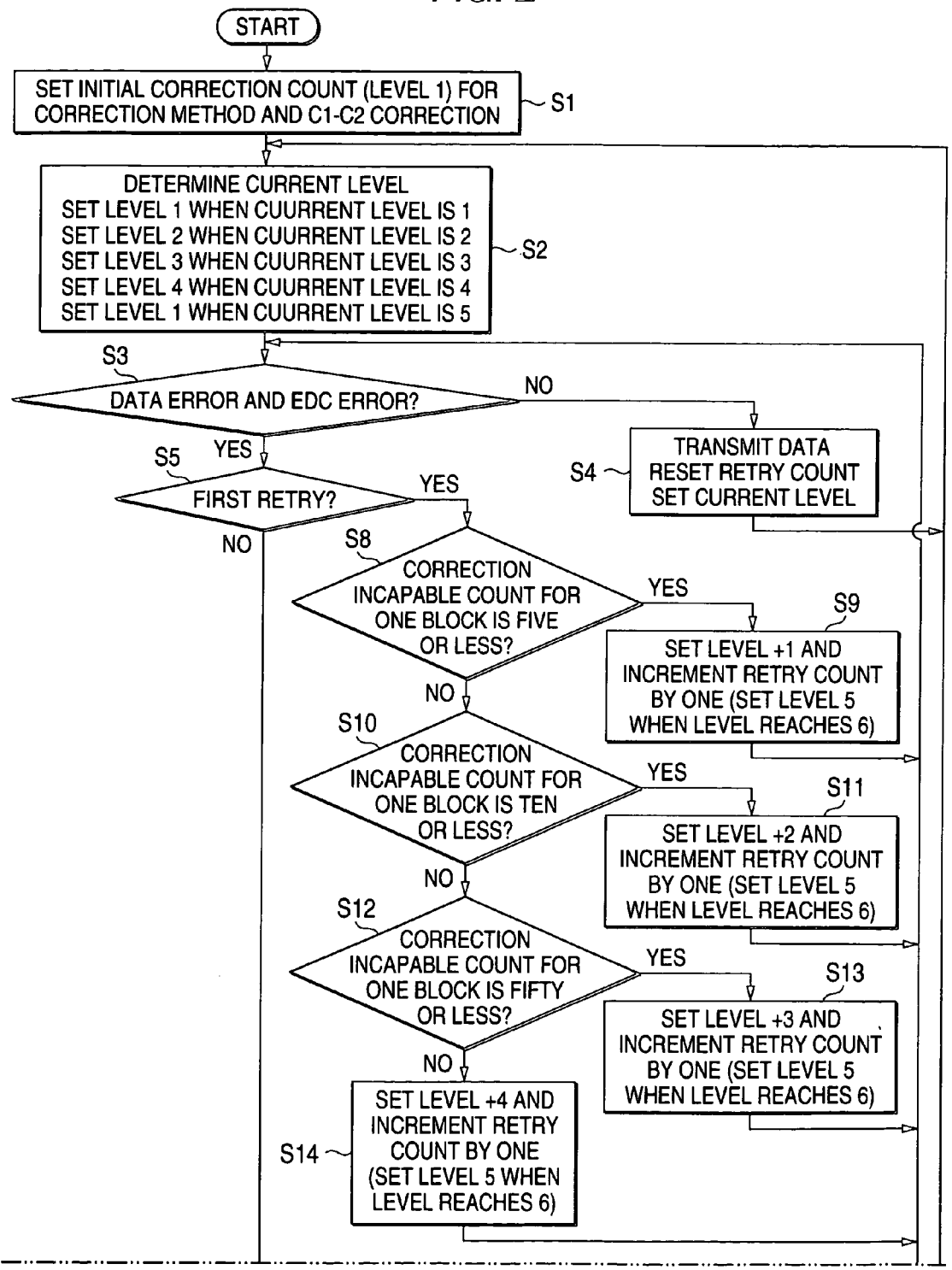
FIG. 2 is a flowchart showing an error correction method according to the present invention.

FIG. 2 is a flowchart showing an example of an error correction method applied to the reproduction system described above. While referring to FIG. 2, an explanation will be given for the processing whereby, in accordance with the detected number of error correction incapable data, an error correction algorithm having high correction strength is selected and employed to perform error correction. First, the microcomputer 8 fetches, from the error correction circuit 6, an ECC block of error correction disabling information (EDC error), and detects from the C1 error correction results in the ECC block the total number of error corrections and the number of correction incapable rows, and detects from the C2 error correction results the total number of error corrections and the number of correction incapable columns. As a result, the quality of the data can be obtained by referring to the number of error corrections and the number of correction incapable columns. The error rate calculated using the number of error corrections and the number of correction incapable data sets may also be employed to obtain the data quality.

During the processing, an error correction method and level 1 (C1 to C2), the initial value for an error count, are set (step S1). Then, the current level set for the error correction circuit 6 is examined to set a new level (step S2). When level 5, which is the highest correction strength, is detected, level 1 is set, and the error correction algorithm at this level is employed to perform the error correction for the data read from the disk 1. During this error correction process, the C1 error correction (error correction performed in the direction of rows) and the C2 error correction (error correction performed in the direction of columns) are repeated.

Next, the microcomputer 8 permits the error determination unit 8a to detect an EDC error, and determines whether there is a data error (step S3). When there is no data error, the error correction algorithm for the current level is set for the error correction circuit 6 (step S4). Since the error correction algorithm with which the data error correction has been completed is held, the probability that a data error will occur at the next error correction can be reduced.

In a case where a data error occurs, the retry count is examined (steps S5 and S6). And when the retry count is two or greater, it is assumed that the quality of the data is poor, so that the data are forcibly discharged and the retry count and level 1 are set (step S7). Thereafter, the error correction is performed for the next ECC block.

When the retry count is one, and when the number of error correction incapable data sets in the ECC block is five or less (step S8), an error correction algorithm having correction strength one level higher than that in the error correction algorithm set at step S2 is designated (step S9). When the number of error correction incapable data sets is between six and 10 (step S10), an error correction algorithm having correction strength two levels higher than that in the error correction algorithm set at step S2 is designated (step S11). When the number of error correction incapable data sets is between 11 and 50 (step S12), an error correction algorithm having correction strength three levels higher than that in the error correction algorithm set at step S2 is designated (step S13). When the number of error correction data sets exceeds 50, an error correction algorithm having correction strength four levels higher than that in the error correction algorithm set at step S2 is designated (step S14). In the embodiment, since error correction algorithms having levels higher than level 5 are not prepared, an error correction algorithm at level 5 is set when the level reaches 6. The retry count is also incremented by one when the higher error correction algorithm is set. The C1 error correction and the C2 error correction are repeated by using error correction algorithms having different correction strengths, and in accordance with the selected error correction algorithms, error corrections are performed beginning with both the direction of the rows in the ECC error correction block and the direction of the columns in the ECC error correction block.

When an error correction has been performed using a new correction algorithm having a different correction strength, and when a data error is still detected at step S3, the second retry count is examined at step S6, and the same process as that for the first retry count is performed from step S15 to step S21.

During the above error correction processing, between the first retry count and the second retry count, the correction algorithm is selected in accordance with the same contents. However, the correction algorithm may be selected based on different contents, e.g., the correction algorithm may be selected while the number of error correction incapable data sets is changed.

In the embodiment, error correction has been performed for the same data. However, the error correction may be performed by again reading data from the disk 1. For the re-reading of data, the microcomputer 8 transmits a control signal to the servo controller 9 to instruct the re-reading of data (see FIG. 1). Based on the control signal, servo control for the spindle motor 2 and the pickup 3 is provided by the servo controller 9 for the re-reading of the data.

During the error correction processing accompanying the re-reading of data, when error correction based on the error correction algorithm at level 1 is not satisfactory, a newly set error correction algorithm at level 2 is employed to perform the error correction. When the error correction based on the error correction algorithm at level 2 is still not satisfactory, the same data are again read from the disk and the error correction for the data is again performed using the same error correction algorithm at level 2, while in the embodiment, the quality of the data is regarded as poor and the data are forcibly discharged at step S7. Thereafter, as well as in the embodiment for the invention, the error correction is repeated by sequentially employing error correction algorithms having higher levels of correction strength.

As another method, there may be configured that when the number of correction incapable data sets or the error rate exceeds a predetermined threshold value, it is assumed that the data error occurred due to such causes as vibrations or scratches, and the error correction is performed for data re-read from the disk. When the number of correction incapable data sets or the error rate is equal to or smaller than the predetermined threshold value, the re-reading of data is not performed and the error correction is performed in the same manner as in the embodiment.

In the embodiment of the invention, the error correction has been performed for data read from a DVD. However, the same error correction process can be performed for data read from a CD. It should be noted, however, that since the error correction for a CD is performed for each frame instead of for each block, at level 1, a maximum of two symbols, for both the C1 error and the C2 error, are regarded as correctable for one frame (C1 double and C2 double). Similarly, at level 2, a maximum of two symbols for the C1 error and a maximum of three symbols for the C2 error are regarded as correctable for one frame (C1 double and C2 triple). At level 3, a maximum of two symbols for the C1 error and a maximum of four symbols for the C2 error are regarded as correctable for one frame (C1 double and C2 quadruple). The data error correction performed for the CD can be performed in the same manner by replacing, during a unit hour and during the DVD data error correction processing, the number of correction incapable data sets at steps S8, S10, S12, S15, S17 and S19 with the C1 error or the C2 error.

As is described above, according to the embodiment, a plurality of error correction processes having different correction strengths can be employed together to perform the error correction, and to thus improve the error correction capability.

Although the present invention has been shown and described with reference to a specific preferred embodiment, various changes and modifications will be apparent to those skilled in the art from the teachings herein. Such changes and modifications as are obvious are deemed to come within the spirit, scope and contemplation of the invention as defined in the appended claims.

What is claimed is:

1. An error correction method for performing error correction for data to which error correction data have been added, the method comprising:
   selecting a first error correction algorithm from a plurality of error correction algorithms having different correction strengths;
   employing the selected first error correction algorithm to perform error correction for the data;
   determining whether or not the first error correction algorithm is capable of correcting errors in the data;
   selecting a second error algorithm from the plurality of error correction algorithms when it is determined that the first error correction algorithm is not capable of correcting errors in the data; and
   employing the selected second error correction algorithm to perform error correction for the data.

2. The error correction method as claimed in claim 1, wherein the selecting of the second error correction algorithm comprises selecting an error correction algorithm in which the correction strength is greater than that in the first error correction algorithm.

3. The error correction method as claimed in claim 1, wherein the selecting of the second error correction algorithm comprises selecting the first error correction algorithm as the second error correction algorithm.

4. The error correction method as claimed in claim 1, wherein the selecting of the second error correction algorithm comprises selecting the second error correction algorithm based on error correction results obtained when the error correction is performed using the first error correction algorithm.

5. The error correction method as claimed in claim 1, wherein the selecting of the second error algorithm comprises selecting an error correction algorithm in which the correction strength level is higher than that in the first error correction algorithm.

6. The error correction method as claimed in claim 1, wherein the performing of the error correction using the first error correction algorithm and the performing of the error correction using the second error correction algorithm comprise repeating the error correction for data, respectively.

7. The error correction method as claimed in claim 1, wherein the performing of the error correction using the first error correction algorithm and the performing of the error correction using the second error correction algorithm comprise performing the error correction for each predetermined block forming a plurality of rows and a plurality of columns, respectively, and
   wherein the performing of the error correction for the predetermined block comprises either performing the error correction in the direction of the rows, or performing the error correction in the direction of the columns.

8. The error correction method as claimed in claim 1, wherein the performing of the error correction using the second error correction algorithm comprises performing the error correction for new data that have been obtained, instead of the data for which the error correction has been performed using the first error correction algorithm.

9. The error correction method as claimed in claim 1, further comprising storing an error correction algorithm in which used for error correction for the data.

10. An error correction apparatus for performing error correction for data to which error correction data have been added, comprising:
   an error correction unit configured to perform error correction for the data using a first error correction algorithm that has been selected from among a plurality of error correction algorithms having different correction strengths;
   a determination unit configured to determine whether or not the error correction for the data using the first error correction algorithm is capable; and
   a controlling unit configured to select a second error correction algorithm from the plurality of error correction algorithms and to control the error correction unit to perform error correction using the second error correction algorithm, for the data in which determined that the error correction using the first error correction algorithm is incapable.

11. The error correction apparatus as claimed in claim 10, wherein the controller selects an error correction algorithm in which the correction strength is greater than that in the first error correction algorithm.

12. The error correction apparatus as claimed in claim 11, wherein the controller selects the first error correction algorithm as the second error correction algorithm.

13. The error correction apparatus as claimed in claim 10, wherein the controller selects the second error correction algorithm based on the error correction results obtained when the error correction is performed using the first error correction algorithm.

14. The error correction apparatus as claimed in claim 10, wherein the controller selects an error correction algorithm in which the correction strength level is higher than that in the first error correction algorithm.

15. The error correction apparatus as claimed in claim 10, wherein the error correction unit repeats the error correction for the data using the first error correction algorithm or the second error correction algorithm.

16. The error correction apparatus as claimed in claim 10, wherein the error correction unit employs the first error correction algorithm and the second error correction algorithm to perform the error correction for each predetermined block forming a plurality of rows and a plurality of columns.

17. The error correction apparatus as claimed in claim 10, wherein the error correction unit performs the error correction for new data that are obtained, instead of for the data for which the error correction has been performed using the first error correction algorithm.

18. The error correction apparatus as claimed in claim 10, wherein the error correction unit stores an error correction algorithm in which used for error correction for the data.

19. An error correction program product for causing a computer system to execute procedures for performing error correction for data to which error correction data have been added, the program product comprising:
   a unit for selecting a first error correction algorithm from a plurality of error correction algorithms having different correction strengths;
   a unit for employing the selected first error correction algorithm to perform error correction for the data;
   a unit for determining whether or not the first error correction algorithm is capable of correcting errors in the data;
   a unit for selecting a second error algorithm from the plurality of error correction algorithms when it is determined that the first error correction algorithm is not capable of correcting errors in the data; and
   a unit for employing the selected second error correction algorithm to perform error correction for the data.

* * * * *